United States Patent
Whetsel et al.

(10) Patent No.: US 9,691,926 B2
(45) Date of Patent: Jun. 27, 2017

(54) USING SOLAR CELLS AS BYPASS DIODE HEAT SINKS

(71) Applicant: Google Inc., Mountain View, CA (US)

(72) Inventors: Clinton L. Whetsel, Albuquerque, NM (US); Matthew A. Nubbe, Moriarty, NM (US)

(73) Assignee: X Development LLC, Mountain View, CA (US)

( * ) Notice: Subject to any disclaimer, the term of this patent is extended or adjusted under 35 U.S.C. 154(b) by 85 days.

(21) Appl. No.: 14/505,357

(22) Filed: Oct. 2, 2014

(65) Prior Publication Data

US 2016/0099363 A1 Apr. 7, 2016

(51) Int. Cl.
*B64C 3/26* (2006.01)
*H01L 31/052* (2014.01)
*B64D 41/00* (2006.01)

(52) U.S. Cl.
CPC .............. *H01L 31/052* (2013.01); *B64C 3/26* (2013.01); *B64D 41/00* (2013.01); *B64D 2041/002* (2013.01); *B64D 2211/00* (2013.01)

(58) Field of Classification Search
CPC ............. H01L 31/03921; H01L 31/052; H01L 31/042; H01L 27/146; B64D 2211/00; B64D 41/00; B64D 2041/002; B64C 3/26
USPC ............ 438/66, 73, 122; 361/704, 708, 710; 257/706, 707, 713, 720; 136/246, 259
See application file for complete search history.

(56) References Cited

U.S. PATENT DOCUMENTS

| | | | |
|---|---|---|---|
| 4,609,770 A * | 9/1986 | Nishiura | H01L 31/02008 136/244 |
| 5,810,284 A | 9/1998 | Hibbs et al. | |
| 6,291,761 B1 * | 9/2001 | Takada | H01L 31/03529 136/244 |
| 7,592,536 B2 | 9/2009 | Glenn | |
| 7,928,315 B2 | 4/2011 | Nagai et al. | |
| 8,563,849 B2 * | 10/2013 | Johnston | H01L 31/052 136/243 |
| 8,809,671 B2 * | 8/2014 | Linderman | H01L 31/02021 136/244 |

(Continued)

FOREIGN PATENT DOCUMENTS

WO WO 2011/127575 A1 10/2011

OTHER PUBLICATIONS

PCT/US2015/050462—PCT International Search Report and Written Opinion, mail date Jan. 13, 2016, 12 pages.

*Primary Examiner* — Medhat Badawi
*Assistant Examiner* — Vicente Rodriguez
(74) *Attorney, Agent, or Firm* — Blakely Sokoloff Taylor & Zafman LLP

(57) ABSTRACT

A solar panel includes a plurality of solar cells, a bypass diode unit, and a heat spreader. The bypass diode unit includes a bypass diode coupled in an electrical shunting configuration across at least a first solar cell of the plurality of solar cells to bypass current around at least the first solar cell in an event of failure of the first solar cell. The heat spreader is disposed over a portion of one or more of the solar cells. The bypass diode unit is disposed on a first side of the heat spreader with the bypass diode in thermal contact with the heat spreader. A second side of the heat spreader is mounted in thermal contact with the one or more of the solar cells to dissipate heat generated in the bypass diode to the one or more of the solar cells.

20 Claims, 5 Drawing Sheets

(56) References Cited

U.S. PATENT DOCUMENTS

| | | | |
|---|---|---|---|
| 8,859,892 B2 | 10/2014 | Lamarche et al. | |
| 2006/0207645 A1* | 9/2006 | Wada | H01L 31/048 |
| | | | 136/244 |
| 2010/0108119 A1 | 5/2010 | Gee et al. | |
| 2010/0139752 A1 | 6/2010 | Fang | |
| 2010/0147364 A1* | 6/2010 | Gonzalez | H01L 31/02021 |
| | | | 136/251 |
| 2012/0125682 A1 | 5/2012 | Lu et al. | |
| 2012/0199194 A1 | 8/2012 | Lamarche et al. | |
| 2013/0003307 A1 | 1/2013 | Jang | |
| 2013/0048242 A1 | 2/2013 | Ofoma et al. | |
| 2013/0189805 A1* | 7/2013 | Thompson | H01L 51/448 |
| | | | 438/28 |
| 2013/0206203 A1 | 8/2013 | Lommasson et al. | |

\* cited by examiner

USING SOLAR CELLS AS BYPASS DIODE HEAT SINKS

TECHNICAL FIELD

This disclosure relates generally to solar cells, and in particular but not exclusively, relates to heat dissipation in connection with solar cell systems.

BACKGROUND INFORMATION

There is a need for a viable solution for dissipating heat in electrical components of a solar powered high altitude unmanned aerial vehicle (UAV). Free airflow at altitudes greater than 60,000 feet becomes ineffective at dissipating heat since the air has substantially less density than it has on the earth's surface. Low speed, high altitude UAVs have a substantially thick boundary layer between free flowing air and the wing's surface, effectively acting as insulation. Furthermore, the solar array itself absorbs substantial heat from the sun in operation, dissipating this into the nearby environment and effectively raising the environmental temperature for nearby components.

The result of these conditions can cause electronics disposed near the solar cell arrays to heat up significantly beyond their specified operating temperatures, and in some cases, eventually go into thermal runaway. Conventional heat sinks are typically heavy and not well suited for light weight applications, such as aerial vehicles, where they can cause high drag penalties when exposed on exterior surfaces.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

DETAILED DESCRIPTION

Embodiments of an apparatus, system, and method for dissipating heat generated by a bypass diode into solar cells are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
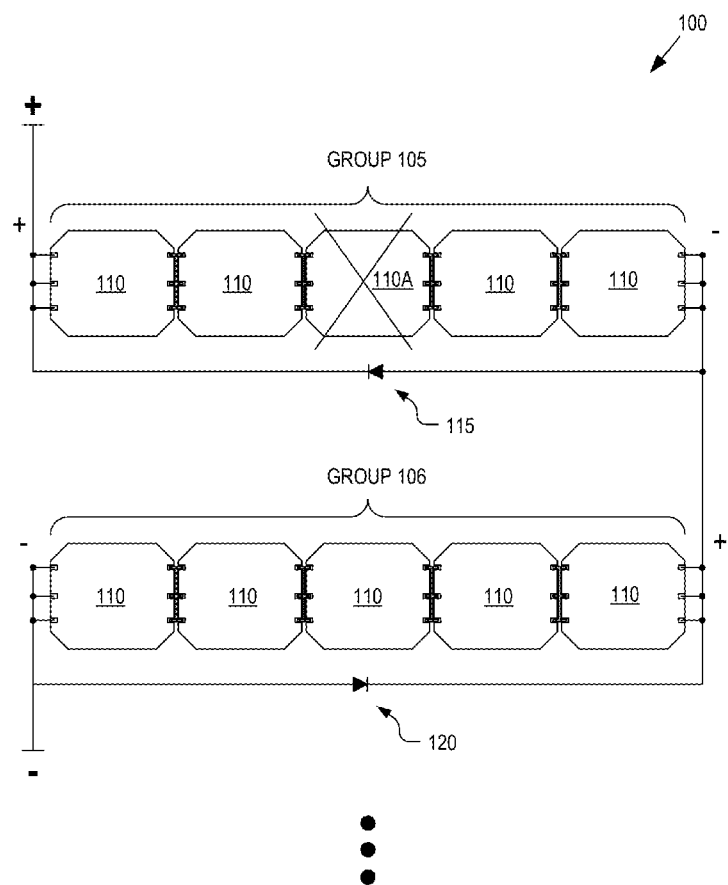
FIG. 1 illustrates operation of a bypass diode when a solar cell fails, in accordance with an embodiment of the disclosure.

FIG. 1 illustrates operation of bypass diodes when a solar cell fails, in accordance with an embodiment of the disclosure. FIG. 1 illustrates a solar panel 100 that includes two groups 105 and 106 of solar cells 110. In the illustrated embodiment, groups 105 and 106 are coupled in series such that their output voltages add. In various other configurations, groups 105 and 106 may also be coupled in parallel such that their output currents add. Although FIG. 1 illustrates just two groups of solar cells each including five solar cells 110, it should be appreciated that in practice solar panel 100 may include any number of groups of solar cells with each group including just one solar cell to large numbers of solar cells.

Bypass diode 115 is coupled in an electrical shunting configuration across group 105 while bypass diode 120 is coupled in an electrical shunting configuration across group 106. During regular operation, bypass diodes 115 and 120 are reverse biased and essentially open circuit the shunting paths. However, should one or more solar cells 110 within a group of solar cells fail, the corresponding bypass diode becomes forward biased, thereby close circuiting the shunting path and allowing current to flow around the failed solar cell. For example, if solar cell 110A fails, it can open circuit the current path through group 105, causing bypass diode 115 to become forward biased. Current then flows through the forward biased bypass diode 115 allowing the remaining groups of solar cells within solar panel 100 to continue operation.

Any one of solar cells 110 within solar panel 100 may fail for a variety of reasons. Thermal contraction/expansion forces, vibrations, mechanical stresses, blunt trauma, or otherwise can result in a cracked or fractured solar cell. Fractured solar cells no longer operate effectively, such that the current path through the failed solar cell is essentially open circuited. Failure is defined broadly herein to also include temporary failure scenarios where solar cell 110A is shaded from solar energy sufficiently more than the other solar cells 110 in group 105, such that it temporarily becomes open circuited. In this temporary failure scenario, current from group 106 is also bypassed around group 105 via bypass diode 115. Bypass diodes 115 and 120 operate as a failsafe mechanism that enables the remaining series connected groups within solar panel 100 to continue to operate and generate electricity despite one or more failed solar cells 110A.

When bypass diode 115 becomes forward biased due to the failure of solar cell 110A, it shunts group 105. The current from the other active groups (e.g., group 106) is bypassed around group 105 through diode 115. This current can be substantial. Without adequate heat dissipation, bypass diode 115 will heat up significantly beyond its specified operating temperature and even eventually fail. In weight constrained high altitude applications, such as high altitude aerial vehicles, heat dissipation is complicated by the fact that payload constraints preclude the use of heavy heat sinks, efficiency constraints preclude the use of high drag heat sinks, and the rarefied atmosphere does not provide for efficient convective heat dissipation.

Accordingly, embodiments of the instant application conduct the heat generated in a forward biased bypass diode into one or more surrounding solar cells 110, which operate as heat sinks for the bypass diode. The solar cells 110 dissipate into the environment via blackbody thermal radiation and convection to the extent available by the surrounding environment without incurring undue drag. In one embodiment, the bypass diodes are thermally connected to one or more solar cells 110 within their own corresponding group. In this way, only solar cells that are no longer functioning are repurposed as sinks. In other embodiments, the bypass diodes may be thermally connected to one or more solar cells 110 from multiple different groups.

Figure 2:
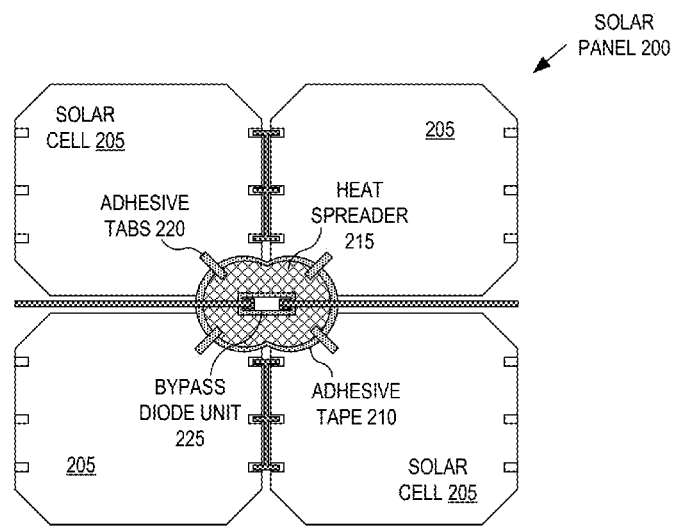
FIG. 2 is a plan view illustration of a bypass diode unit mounted on a heat spreader that dissipates heat into adjacent solar cells, in accordance with an embodiment of the disclosure.
Figure 3:
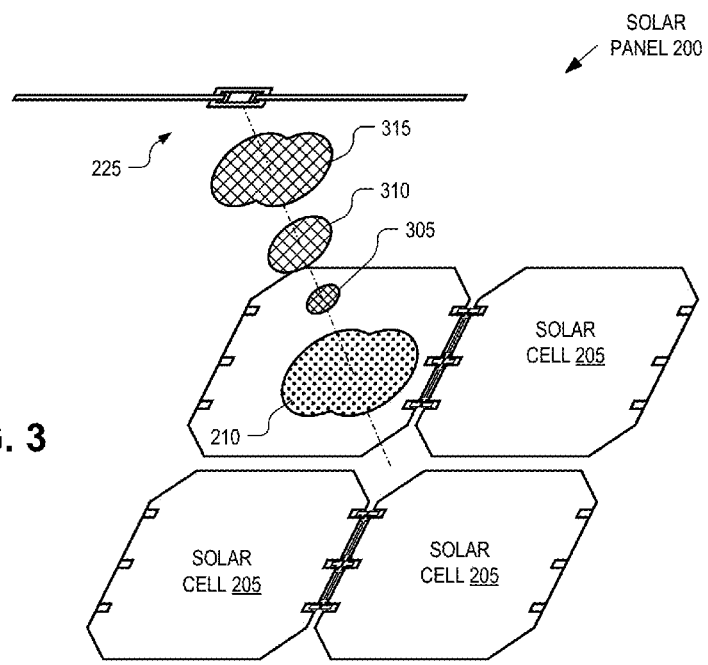
FIG. 3 is an exploded perspective view illustration of a heat spreader and bypass diode unit, in accordance with an embodiment of the disclosure.
Figure 4:
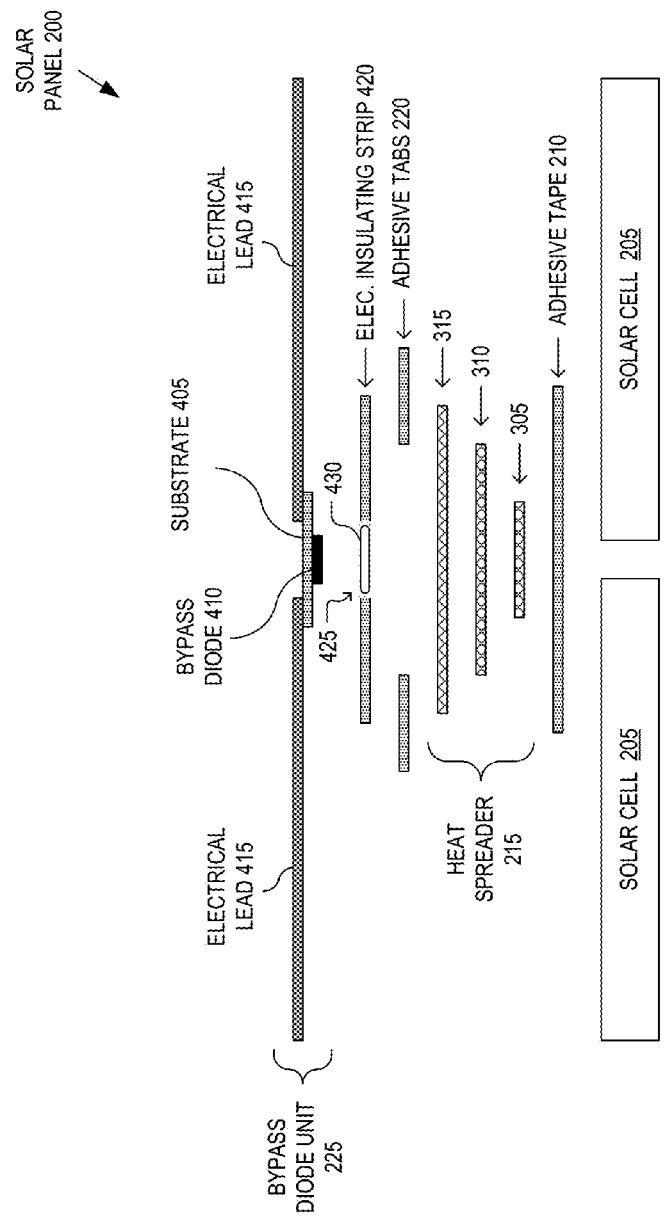
FIG. 4 is an exploded side view illustration of a bypass diode unit and heat spreader mounted over solar cells, in accordance with an embodiment of the disclosure.

FIGS. 2, 3, and 4 illustrate various views of a portion of a solar panel 200 that includes a bypass diode unit mounted on a heat spreader that dissipates heat into adjacent solar cells, in accordance with an embodiment of the disclosure. FIG. 2 is a plan view, FIG. 3 is an exploded perspective view, and FIG. 4 is an exploded side view all of the same portion of solar panel 200. Solar panel 200 represent one possible implementation of solar panel 100 illustrated in FIG. 1.

The illustrated portion of solar panel 200 includes solar cells 205, adhesive tape 210, a heat spreader 215, adhesive tabs 220, and a bypass diode unit 225 (only some instances of elements are labeled so as not to clutter the drawings). The illustrated embodiment of heat spreader 215 includes flexible film layers 305, 310, and 315 (see FIGS. 3 and 4). The illustrated embodiment of bypass diode unit 225 includes a substrate 405, a bypass diode 410, and electrical leads 415 (see FIG. 4). The illustrated embodiment further includes an electrical insulating strip 420 with a hole 425 and thermally conductive paste 430 disposed between bypass diode unit 225 and heat spreader 215 (see FIG. 4).

Heat spreader 215 operates to dissipate heat generated within bypass diode 410 via conductive heat transfer to solar cells 205. In the illustrated embodiment, heat spreader 215 is formed of stacked flexible film layers 305, 310, and 315. Although three layers are illustrated, it should be appreciated that more or less layers may be implemented. In one embodiment, flexible film layers 305, 310, and 315 are concentrically stacked with the smallest surface area layer 305 on the bottom (proximate to solar cells 205) and the largest surface area layer 315 on top (proximate to bypass diode 410). In this embodiment, the flexible film layers monotonically increase in surface area from the bottom up towards bypass diode 410. This technique serves to reduce thermal resistance nearest to bypass diode 410 for improved conductive heat dissipation. In one embodiment, flexible film layer 305 has a diameter of 16 mm, flexible film layer 310 has a diameter of 32 mm, and flexible film layer 315 has a diameter of 48 mm. Of course other dimensions and numbers of layers may be implemented.

Heater spreader 215 is well suited for conducting heat away from bypass diode 410 in contoured surfaces where solar panel 200 has been embedded in the skin of an object (e.g., wing-skin of an aerial vehicle). As such, the layers of heat spreader 215 are formed of flexible conductive sheets. In one embodiment, flexible film layers 305, 310, and 315 are fabricated of pyrolytic graphite sheet ("PGS") material. PGS is light weight and thin (e.g., 0.025 mm thick) and highly conductive (e.g., 1600 W/mK) and as such, well suited for the weight constrained application of aerial vehicles. Of course, other materials and techniques may be used to implement the layers of heat spreader 215 such including aluminum, copper, silver, vapor chambers, or otherwise. Flexible film layers 305, 310, and 315 are disposed on and conform to the surface of solar cells 205. They are shaped and sized to spread heat to one or more (e.g., two or four) adjacent solar cells 205, which have good thermal conductivity themselves. In one embodiment, solar cells 305 are silicon solar cells. Other types of thermally conductive solar cells may also be used. Coupling heat to solar cells 205 greatly increases the size of the heat sink thermally coupled to bypass diode 410 in a cost effective and light weight solution.

Heat spreader 215 saves weight over conventional heat sink techniques by using highly thermal conductive layers 305, 310, and 315 to spread heat into multiple solar cells 205. These solar cells are already present. This solution reduces wiring complexity by embedding heat spreader 215 into skin structure of the underlying substrate and not remotely located from solar cells 205. This solution negates the use of heat fins or similar object inserted into an airstream, which can negatively affect aerodynamic performance of an aerial vehicle. Although the embodiments described herein are well-suited for weight constrained aerial vehicles, by pass diode unit 225 and heat spreader 215 are also suitable for use with other applications that use solar panels with bypass diodes (e.g., terrestrial vehicles, marine vessels, stationary objects, or otherwise).

In one embodiment, adhesive tape 210 is single sided tape with the adhesive side facing heat spreader 215 to hold the layers of heat spreader 215 together. Adhesive tape 210 should be thermally conductive to allow heat to conduct through the tape to solar cells 205. Adhesive tape 210 may also be electrically insulating to prevent electrical shorts between heat spreader 215 and one or more solar cells 205. In one embodiment, adhesive tape 210 is Kapton tape.

In one embodiment, adhesive tabs 220 are also fabricated of single sided tape and serve to hold heat spreader 215 in the desired position over solar cells 205. Adhesive tabs 220 may also be fabricated of small strips of Kapton tape.

In order to prevent electrical shorts between bypass diode unit 225 and heat spreader 215, the illustrated embodiment includes an electrical insulating strip 420 positioned between bypass diode unit 225 and heat spreader 215. Electrically insulating strip 420 extends under substrate 405 and portions of electrical leads 415 that overlap heat spreader 215. In order to improve thermal conduction an ensure good thermal contact between bypass diode 410 and heat spreader 215, hole 425 is formed through electrically insulating strip 420 and thermally conductive paste 430 applied. In one embodiment, electrically insulating strip 420 is fabricated with Kapton tape having the adhesive side facing bypass diode unit 225.

Figure 5A:
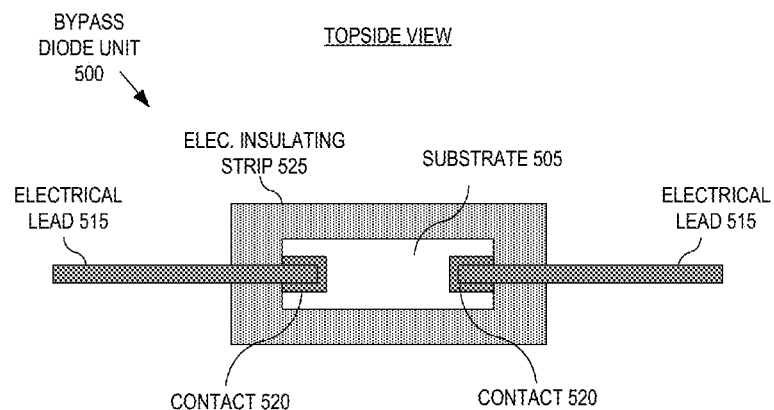
FIGS. 5A & 5B illustrate top and bottom plan views of a bypass diode unit, in accordance with an embodiment of the disclosure.
Figure 5B:
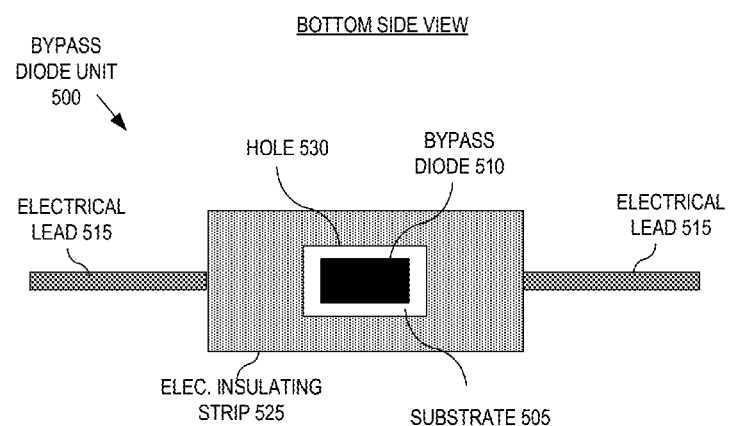

FIGS. 5A & 5B illustrate top and bottom plan views of a bypass diode unit 500, in accordance with an embodiment of the disclosure. Bypass diode unit 500 is one possible implementation of bypass diode unit 225 illustrated in FIGS. 2, 3, and 4. The illustrated embodiment of bypass diode unit 500 includes a substrate 505, a bypass diode 510, electrical leads 515, and contacts 520. An electrical insulating strip 525 having a hole 530 is adhered to the bottom side of bypass diode unit 500.

In the illustrated embodiment, bypass diode 510 is mounted on the bottom side of substrate 505 while electrical leads 515 connect to contacts 520 from the top side of substrate 505. In on embodiment, contacts 520 are thru-substrate contacts that connect bypass diode 510 on the bottom side to electrical leads 515 on the top side. In one embodiment, substrate 505 is flexible, such as a flexible printed circuit board to permit it to conform to a contoured surface.

Electrical insulating strip 525 is positioned beneath bypass diode unit 500 to electrically insulate contacts 520 and electrical leads 515 from the heat spreader positioned below. Electrical insulating strip 525 should extend far enough below electrical leads 515 to bridge the heat spreader and prevent an electrical connection there between. In one embodiment, electrical insulating strip 525 is single sided Kapton tape with the adhesive side facing substrate 505. Electrical insulation strip 525 includes hole 530 to allow bypass diode 510 to make direct physical contact to the heat spreader. To ensure good thermal contact, a thermally conductive paste can be applied to the exposed side of bypass diode 510 and/or the contacting portion of the heater spreader.

Figure 6:
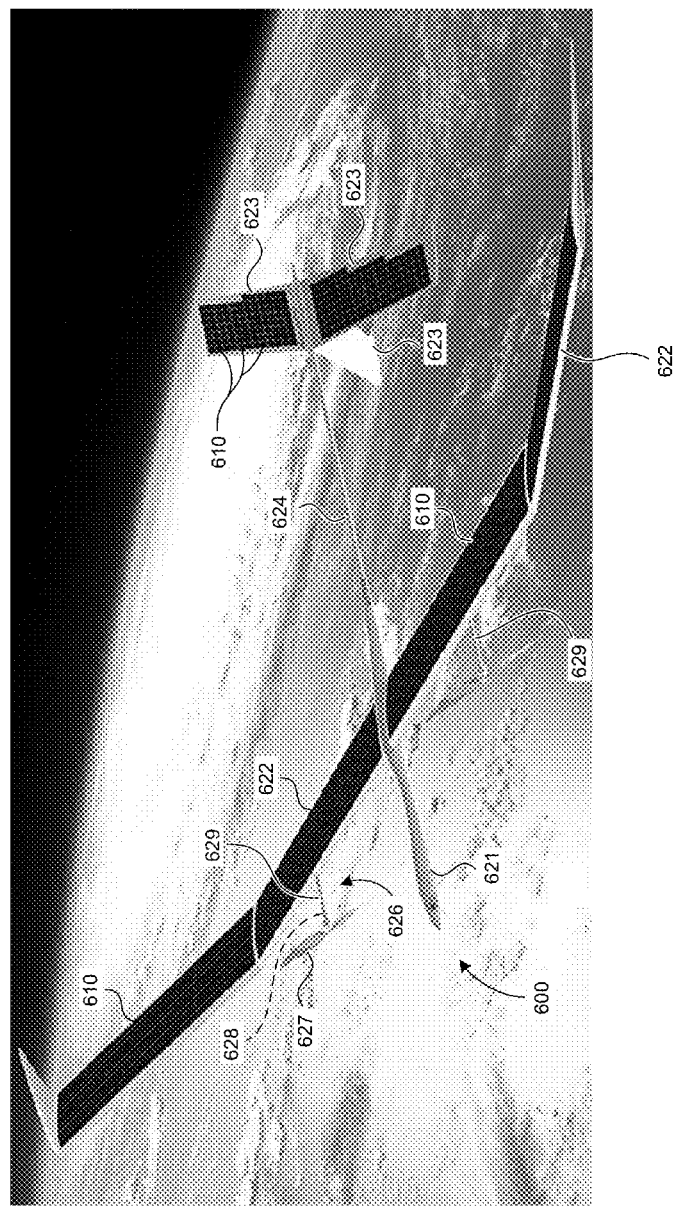
FIG. 6 illustrates an aerial vehicle having solar panels with bypass diodes mounted on heat spreaders embedded in the wing-skin, in accordance with an embodiment of the disclosure.

FIG. 6 illustrates an example aerial vehicle having solar panels with bypass diodes mounted on heat spreaders embedded in the wing-skin, in accordance with an embodiment of the disclosure. The light weight solutions for dissipating heat generated in a bypass diode to surrounding solar cells, as described above, are well suited for aerial vehicles, such as a UAV.

In the illustrated embodiment, an aerial vehicle 600 includes a narrow, elongated fuselage 621 coupled to one or more wings 622 or other lifting surfaces. The aerial vehicle 600 can further include a stabilizer boom or empennage 624 carrying one or more stabilizers 623 that provide stability and control functions. The aerial vehicle 600 can still further include a propulsion system 626, which can in turn include one or more nacelles 629, each of which houses an electric motor 628 that powers a corresponding propeller 627.

UAVs have proliferated recently because they can perform a variety of valuable tasks without incurring the costs and risks associated with a piloted aircraft. Typical UAV tasks include public safety and communication tasks. However, one drawback with many existing UAVs is that they have limited endurance and can accordingly remain on-station for only a limited period of time. As a result, it can be difficult to provide the foregoing tasks consistently for an extended period of time.

One approach to addressing the foregoing endurance issues is to provide solar power to a UAV, potentially enabling the UAV to remain on-station for extended periods of time because it generates the power it requires while in flight. Aerial vehicle 600 includes one or more battery packs to power on-board electrical sub-systems (e.g., propulsion systems 626, actuators for adjusting flight surfaces, communication systems, navigation system, control systems, etc.). Solar panels 610 are coupled to the battery packs to provide continuous charging when solar energy is incident upon their surfaces. As illustrated the solar panels 610, which each include one or more bypass diode units and heat spreaders, are embedded in the wing-skins and other flight control surfaces. During flight, the stresses on the wing structure can lead to a fractured solar cell, which in turn activates a bypass diode to redirect current around the failed solar cell, thereby enabling the remaining solar cells to continue to function.

Aerial vehicle 600 can be particularly configured to fly at very high altitudes (e.g., 65,000 ft) under the power produced by its solar panels 610. At very high altitudes, the rarefied atmosphere does not provide for efficient heat transfer via convection. Accordingly, by spreading the heat generated from the bypass diode out to one or more solar cells within a solar panel, a combination of greater thermal contact with the passing air and greater increased blackbody radiation area permit operation at temperatures only slightly above that of the adjacent solar cells. In one embodiment, the bypass diodes are thermally connected to the very solar cells that they shunt. In this embodiment, only failed solar cells (or actively bypassed solar cells) are repurposed as heat sinks upon failure.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
   a plurality of solar cells;
   a bypass diode unit including a bypass diode coupled in an electrical shunting configuration across at least a first solar cell of the plurality of solar cells to bypass current around at least the first solar cell in an event of failure of the first solar cell;
   a heat spreader disposed over a portion of one or more of the solar cells, wherein the bypass diode unit is disposed on a first side of the heat spreader with the bypass diode in thermal contact with the heat spreader and a second side of the heat spreader in thermal contact with the one or more of the solar cells to dissipate heat generated in the bypass diode to the one or more of the solar cells, wherein the solar cells are disposed on the second side of the heat spreader opposite the first side, wherein the heat spreader includes multiple film layers stacked in physical contact with each other that conduct heat from the bypass diode to the one or more of the solar cells, wherein the multiple film layers monotonically increase in surface area with a largest area layer being proximate to the bypass diode and a smallest area layer being proximate to the one or more of the solar cells.

2. The apparatus of claim 1, wherein the heat spreader comprises a flexible heat spreader and wherein the multiple film layers comprise two or more layers of a flexible film that conducts heat from the bypass diode to the one or more of the solar cells.

3. The apparatus of claim 2, wherein the flexible film comprises a pyrolytic graphite sheet ("PGS").

4. The apparatus of claim 2, wherein the two or more layers of the flexible film are concentrically stacked and aligned under the bypass diode.

5. The apparatus of claim 4, wherein the two or more layers of the flexible film comprise three layers of pyrolytic graphite sheets.

6. The apparatus of claim 1, wherein the bypass diode unit includes:
a flexible substrate having a first side and a second side;
the bypass diode disposed on the first side;
electrical leads extending from the second side; and
contacts extending through the flexible substrate to electrically connect the bypass diode on the first side to the electrical leads on the second side.

7. The apparatus of claim 6, further comprising:
an electrical insulating strip disposed between the heat spreader and the bypass diode unit to electrically insulate the electrical leads from the heat spreader, wherein the electrical insulating strip includes a hole under the bypass diode; and
a thermally conductive paste disposed in the hole to thermally connect the bypass diode to the heat spreader.

8. The apparatus of claim 1, further comprising:
a single sided adhesive tape disposed between the heat spreader and the one or more of the solar cells, wherein an adhesive side of the single sided adhesive tape faces the heat spreader to adhere to the heat spreader, wherein the single sided adhesive tape electrically insulates the heat spreader from the one or more of the solar cells.

9. The apparatus of claim 8, further comprising:
single sided adhesive tabs bridging the heat spreader and the one or more of the solar cells to secure the heat spreader to the one or more of the solar cells.

10. An aerial vehicle, comprising:
a wing having a wing-skin;
a solar panel embedded into the wing-skin to power one or more electrical sub-systems of the aerial vehicle, the solar panel including:
a plurality of solar cells;
a bypass diode unit including a bypass diode coupled in an electrical shunting configuration across a group of the solar cells to bypass current around the group in an event of failure of one of the solar cells within the group;
a heat spreader disposed over a portion of one or more of the solar cells, wherein the bypass diode unit is disposed on a first side of the heat spreader with the bypass diode in thermal contact with the heat spreader and a second side of the heat spreader in thermal contact with the one or more of the solar cells to dissipate heat generated in the bypass diode to the one or more of the solar cells, wherein the solar cells are disposed on the second side of the heat spreader opposite the first side, wherein the heat spreader includes two or more layers of thermally conductive film stacked on top of each other, wherein the two or more layers of thermally conductive film monotonically increase in surface area with a largest area layer being proximate to the bypass diode and a smallest area layer being proximate to the one or more of the solar cells.

11. The aerial vehicle of claim 10, wherein the heat spreader comprises a flexible heat spreader and wherein the two or more layers of thermally conductive film comprise two or more layers of flexible film that conduct heat from the bypass diode to the one or more of the solar cells.

12. The aerial vehicle of claim 11, wherein each of the two or more layers of flexible film comprises a pyrolytic graphite sheet ("PGS").

13. The aerial vehicle of claim 11, wherein the two or more layers of the flexible film are concentrically stacked and aligned under the bypass diode.

14. The aerial vehicle of claim 13, wherein the two or more layers of the flexible film comprise three layers of pyrolytic graphite sheets.

15. The aerial vehicle of claim 10, wherein the bypass diode unit includes:
a flexible substrate having a first side and a second side;
the bypass diode disposed on the first side;
electrical leads extending from the second side; and
contacts extending through the flexible substrate to electrically connect the bypass diode on the first side to the electrical leads on the second side.

16. The aerial vehicle of claim 15, further comprising:
an electrical insulating strip disposed between the heat spreader and the bypass diode unit to electrically insulate the electrical leads from the heat spreader, wherein the electrical insulating strip includes a hole under the bypass diode; and
a thermally conductive paste disposed in the hole to thermally connect the bypass diode to the heat spreader.

17. The aerial vehicle of claim 10, further comprising:
a single sided adhesive tape disposed between the heat spreader and the one or more of the solar cells, wherein an adhesive side of the single sided adhesive tape faces the heat spreader to adhere to the heat spreader, wherein the single sided adhesive tape electrically insulates the heat spreader from the one or more of the solar cells.

18. The aerial vehicle of claim 17, further comprising:
single sided adhesive tabs bridging the heat spreader and the one or more of the solar cells to secure the heat spreader to the one or more of the solar cells.

19. An apparatus, comprising:
a plurality of solar cells;
a bypass diode unit including a bypass diode coupled in an electrical shunting configuration across at least a first solar cell of the plurality of solar cells to bypass current around at least the first solar cell in an event of failure of the first solar cell; and
a heat spreader disposed over a portion of two or more of the solar cells, wherein the bypass diode unit is disposed on a first side of the heat spreader with the bypass diode in thermal contact with the heat spreader and a second side of the heat spreader in thermal contact with the two or more of the solar cells to dissipate heat generated in the bypass diode to the one or more of the solar cells, wherein the two or more solar cells are disposed on the second side of the heat spreader opposite the first side, wherein the heat spreader includes stacked film layers that conduct heat from the bypass diode to the one or more of the solar cells, wherein the stacked film layers monotonically increase in surface area with a largest area layer being proximate to the bypass diode and a smallest area layer being proximate to the one or more of the solar cells,
wherein the bypass diode is physically disposed between the two or more of the solar cells.

20. The apparatus of claim 19, further comprising:
an electrically insulating layer different than the stacked film layers disposed between the stacked film layers and the one or more of the solar cells to electrically insulate the heat spreader from the one or more of the solar cells.

* * * * *